United States Patent
Albers et al.

(10) Patent No.: US 8,154,049 B2
(45) Date of Patent: *Apr. 10, 2012

(54) ESD PROTECTION APPARATUS AND ELECTRICAL CIRCUIT INCLUDING SAME

(75) Inventors: Sven Albers, Regensburg (DE); Klaus Diefenbeck, Munich (DE); Bernd Eisener, Hohenbrunn (DE); Gernot Langguth, Oberhaching (DE); Christian Lehrer, Linz (AU); Karl-Heinz Malek, Aschheim (DE); Eberhard Rohrer, Neufahrn bei Freising (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/848,668

(22) Filed: Aug. 2, 2010

(65) Prior Publication Data
US 2010/0295094 A1    Nov. 25, 2010

Related U.S. Application Data

(63) Continuation of application No. 12/028,667, filed on Feb. 8, 2008, now Pat. No. 7,888,703.

(30) Foreign Application Priority Data

Feb. 12, 2007    (DE) .................... 10 2007 006 853

(51) Int. Cl.
*H01L 29/72* (2006.01)
(52) U.S. Cl. ........ 257/173; 257/213; 257/355; 257/401; 257/500
(58) Field of Classification Search ............. 257/173, 257/213, 355, 401, 500
See application file for complete search history.

(56) References Cited

U.S. PATENT DOCUMENTS

| 5,387,552 A | 2/1995 | Iranmanesh |
| 6,441,437 B1 | 8/2002 | Gossner |
| 6,710,990 B2 | 3/2004 | Walker et al. |
| 6,891,206 B2 | 5/2005 | Czech et al. |
| 7,170,135 B2 | 1/2007 | Zecri et al. |
| 7,888,703 B2 * | 2/2011 | Albers et al. ............. 257/173 |
| 2004/0178455 A1 | 9/2004 | Kojima |

FOREIGN PATENT DOCUMENTS

| DE | 100 05 811 A1 | 8/2001 |
| EP | 1 396 887 A1 | 3/2004 |

* cited by examiner

*Primary Examiner* — Edward Wojciechowicz
(74) *Attorney, Agent, or Firm* — Slater & Matsil, L.L.P.

(57) ABSTRACT

An ESD protection apparatus includes a substrate, a transistor structure arranged in the substrate, and a diode structure arranged in the substrate, a high-resistance electrical connection being provided between the transistor structure and the diode structure in the substrate.

21 Claims, 5 Drawing Sheets

ESD PROTECTION APPARATUS AND ELECTRICAL CIRCUIT INCLUDING SAME

This application is a continuation of patent application Ser. No. 12/028,667, which was filed on Feb. 8, 2008 now U.S. Pat. No. 7,888,703, which claims priority from German Patent Application No. 10 2007 006 853.2, which was filed on Feb. 12, 2007. Both applications are incorporated herein by reference in entirety.

TECHNICAL FIELD

Embodiments of the present invention relate to an ESD (electrostatic discharge) protection apparatus and to an electrical circuit including such an ESD protection device.

BACKGROUND

ESD protection apparatuses and/or ESD protection structures bypass, in an ESD case, the power of the ESD pulse around a device to be protected and thus make the ESD pulse harmless for the device to be protected. In electrical circuits, like, for example, integrated circuits, the ESD protection structure is connected to a pin to which the device to be protected within the circuit is connected. Exemplarily, this may be a signal pin by means of which predetermined signals can be applied to the internal circuit and/or the device to be protected. In the ESD case, an ESD pulse the power of which would result in a destruction of or considerable damage to the device to be protected is applied via this pin. The ESD protection structure is connected to ground or another suitable reference potential and/or to a supply voltage at the pin to be protected. In normal operation, the ESD protection structure is "electrically invisible", so that the device to be protected behaves as if there were no ESD protection structure. In the ESD case, the ESD protection structure clamps the smallest voltage possible, this clamping voltage also being across the parallel path to be protected. The high current impressed by an ESD pulse is drained to ground or the suitable reference potential.

SUMMARY OF THE INVENTION

Embodiments of the invention provide an ESD protection apparatus that includes a substrate, a transistor structure arranged in the substrate, a diode structure arranged in the substrate, and a high-resistance electrical connection between the transistor structure and the diode structure arranged in the substrate.

A further embodiment of the invention provides an ESD protection apparatus with a transistor structure arranged in a substrate, and a diode structure arranged in the substrate. A semiconductor material is arranged between the transistor structure and the diode structure.

BRIEF DESCRIPTION OF THE DRAWINGS

Embodiments of the invention will be discussed subsequently referring to the appended drawings, in which.

DETAILED DESCRIPTION OF ILLUSTRATIVE EMBODIMENTS

Figure 1A:
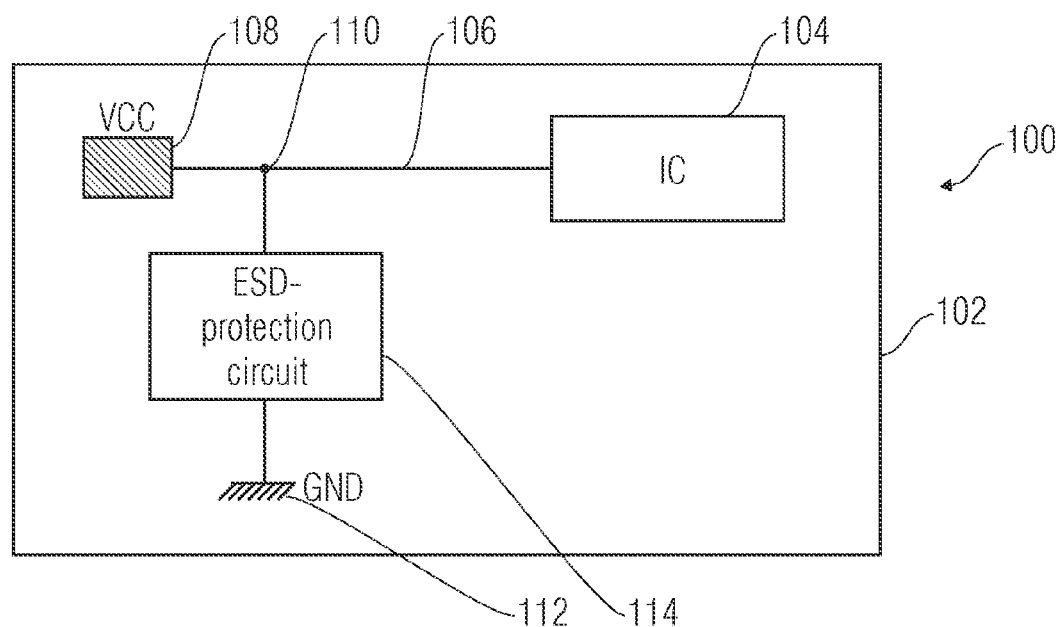
FIG. 1A is a schematic illustration of an electrical circuit including an ESD protection circuit.

Embodiments of the invention provide an ESD protection apparatus comprising a substrate, a transistor structure arranged in the substrate, a diode structure arranged in the substrate, and a high-resistance electrical connection between the transistor structure and the diode structure arranged in the substrate.

Further embodiments of the invention provide a protection apparatus comprising a substrate, an epitaxial well arranged in the substrate and defining a collector region of a bipolar transistor, a first base region of the bipolar transistor arranged in the epitaxial well, a second base region of the bipolar transistor arranged in the epitaxial well laterally offset to the first base region, a first emitter region of the bipolar transistor arranged in the first base region, a second emitter region of the bipolar transistor arranged in the second base region, a first region of a diode arranged in the epitaxial well between the first and second base regions, the epitaxial well further defining a second region of the diode, and a buried layer arranged in the substrate between the epitaxial well and the substrate, the buried layer defining a high-resistance electrical connection between the bipolar transistor and the diode.

Further embodiments of the invention provide an apparatus for ESD protection comprising first means which is active in an ESD case, second means for draining the current present in the ESD case, the first means in the ESD case activating the second means to drain the current, and third means providing a high-resistance electrical connection between the first and second means.

Further embodiments of the invention provide an ESD protection apparatus comprising a transistor structure arranged in a substrate, and a diode structure arranged in the structure, a semiconductor material being arranged between the transistor structure and the diode structure.

Further embodiments of the invention provide an ESD protection apparatus comprising a substrate, an epitaxial well arranged in the substrate and defining a collector region of a bipolar transistor, a first base region of the bipolar transistor arranged in the epitaxial well, a second base region of the bipolar transistor arranged in the epitaxial well laterally offset to the first base region, a first emitter region of the bipolar transistor arranged in the first base region, a second emitter region of the bipolar transistor arranged in the second base region, a first region of a diode arranged in the epitaxial well between the first and second base regions, the epitaxial well further defining a second region of the diode, and a buried layer arranged in the substrate between the epitaxial well and the substrate.

Further embodiments of the invention provide an apparatus for ESD protection comprising first means which is active in an ESD case, and second means for draining the current present in the ESD case, the first means activating the second means to drain the current, the first and second means being implemented to provide in the ESD case a thyristor-like structure for draining the current.

Further embodiments of the invention provide an electrical circuit comprising a first terminal, a second terminal, an internal circuit connected to the first terminal, and an ESD protection apparatus according to embodiments of the invention connected between the first terminal and the second terminal.

FIG. 1A shows an exemplary schematic illustration of an electrical circuit which in its entirety is provided with the reference numeral 100 and exemplarily includes a substrate 102. The electrical circuit 100 includes an integrated circuit 104 arranged on or in the substrate 102 which is connected to a terminal 108 for applying a signal VCC via a signal line 106. The signal line 106 includes a node 110, and an ESD protection circuit 114 is connected between the node 110 and a ground terminal 112 (GND). The electrical circuit shown in FIG. 1A is not limited to the design shown, wherein a plurality of signal lines 106 as well as a plurality of terminals 108 may be provided depending on the design of the integrated circuit 104, corresponding ESD protection circuits being provided to protect the integrated circuit 104. In addition, the design according to FIG. 1A is not limited to using an integrated circuit, but can be applied, too, in electrical circuits 100 in general, wherein other devices to be protected are provided instead of the integrated circuit 104, i.e., devices which may be damaged or even destroyed in the case of high currents in an ESD pulse coupled into the circuit 100 via the terminal 108. In addition, the arrangement shown in FIG. 1A can be arranged in a casing and/or the substrate may be cast into a casing, wherein in this case at least the terminal 108 is exposed to be able to apply the signals for operating the integrated circuit 104.

The ESD protection circuit 114 serves to protect the integrated circuit 104 during a so-called ESD case. During an ESD case, an ESD pulse is coupled into the circuit 100 via the terminal 108 due to an electrostatic discharge (ESD), wherein the ESD pulse may result in such high currents that the integrated circuit 104 may be damaged permanently or even be destroyed completely. Since the ESD protection circuit 114 is only active in this ESD case, it is designed not to break down and additionally to be "electrically invisible" during normal operation of the integrated circuit 104 with the signal levels applied there. At the same time, the ESD protection circuit 114 has to be as low-resistance as possible in the ESD case to bypass the high current reliably around the integrated circuit 104 directly to ground 112. For this reason, the ESD protection circuit 114 is designed to be able to take two voltage states.

Instead of the arrangement of the ESD protection circuit 114 between the terminals VCC and GND shown in FIG. 1, it is generally possible for the ESD protection circuit 114 to be arranged between any two pins of a circuit, the pins being at different potentials.

Figure 1B:
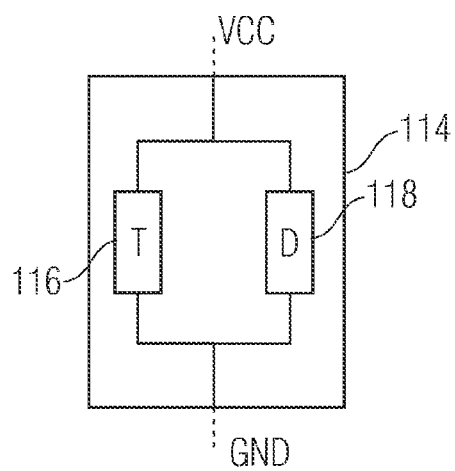
FIG. 1B is an enlarged illustration of the ESD protection circuit of FIG. 1A.

FIG. 1B shows a design of the ESD protection circuit 114 of FIG. 1A including a bipolar transistor 116 connected between the terminal 108 and ground 112. In addition, the ESD protection circuit 114 includes a diode 118 which is also connected between the terminal 108 and ground 112. The bipolar transistor 116 here is designed to exhibit the dielectric strength necessary in normal operation, i.e., not to break down and to be electrically invisible at the operating point of the integrated circuit 104 and with the currents and voltages applied there.

In the ESD case, the bipolar transistor 116 causes the diode 118 to be switched on, to completely pass on the current flowing then to the diode 118 which in the high-current case is low-resistance. Since the current will in this case only flow via the low-resistance diode 118, the entire protection structure 114 is low-resistance. Although FIG. 1B mentions a bipolar transistor and a diode, other suitable circuit elements may also be employed here, the first circuit element 116 in the ESD case causing the second element 118 to be switched on for providing the low-resistance path between the terminal 108 and ground 112 or the reference potential 112. It is to be pointed out here that, in general, transistor structures, such as, among other things, field-effect transistors (like MOS structures), and diode structures may be employed instead of the bipolar transistor and the diode described.

The two individual elements 116 and 118 shown in FIG. 1B in cooperation form a functional complete ESD protection structure.

Figure 2:
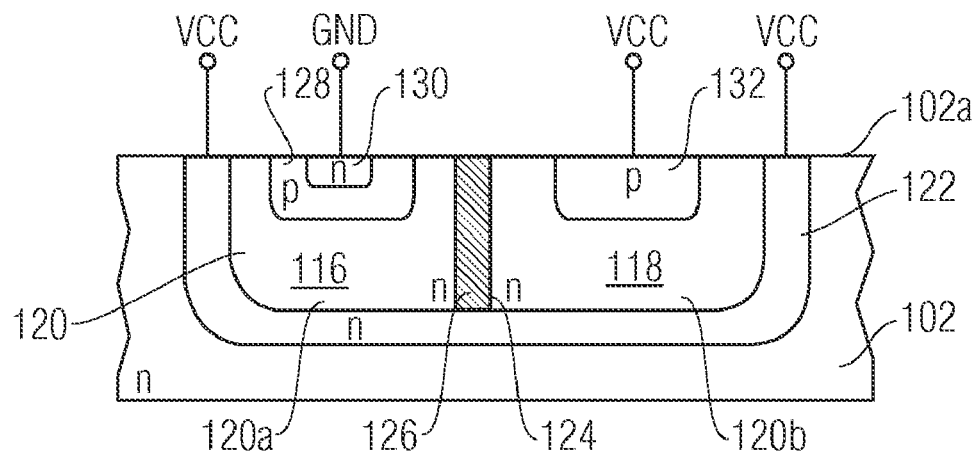
FIG. 2 shows a setup of the ESD protection circuit of FIG. 1B.

FIG. 2 shows the setup of an ESD protection circuit as shown in FIG. 1B. In FIG. 2 the substrate 102, which is also shown in FIG. 1A, is shown, thereby indicating that the ESD protection circuit may be formed integrally with the integrated circuit 104 in a common substrate. However, the invention is not limited to such a design and, rather, includes designs where the ESD protection circuit 114 is designed as an individual element, i.e., is formed separately in an individual substrate, to form an ESD protection chip with which an electrical circuit similar to that shown in FIG. 1 can be equipped for a necessary ESD protection. It is to be pointed out here that the following illustrations of the ESD protection circuit setup are not to scale but are shown in an enlarged manner for the benefit of an improved representation.

In FIG. 2, the substrate 102 is, for example, a silicon substrate having an n-type doping. An epitaxially grown semiconductor region 120 having an n-type doping (EPI well) as well as a buried n layer 122 which has been generated subsequently by means of implantation in the substrate 102 for producing the EPI well 120 are shown in the substrate 102. A trench 124 extending from a top surface 126 of the substrate down to the buried n layer 122 and filled with an electrically insulating material 126, like, for example, an oxide, is formed in the EPI well 120. Instead of the trench design shown, the trench may also be provided in such a manner that it extends from the substrate surface 102a by a predetermined distance in the direction of the substrate, without reaching the buried layer. The EPI well is divided by the trench 124 into a first region 120a and a second region 120b. In the first region 120a of the EPI well 120, a first p-doped region 128 is formed, in which in turn an n-doped region 130 is formed. Additionally, a p-doped region 132 is formed in the second region 120b of the EPI well 120.

An emitter 130, a base 128 and a collector 120a of the npn bipolar transistor 116 are defined by the regions defined in the first region 120a of the EPI well 120. In the ESD protection structure described in FIG. 2, the base terminal of the bipolar transistor structure 116 is "floating", i.e., has no potential provided to it. Alternatively, the base terminal may be connected to a predetermined reference potential. In the second region 120b of the EPI well 120, a p-zone of the diode 118 is defined by the region 132 and the n-zone of the diode 118 is defined by the n-region 120b.

Although in FIG. 2 an ESD circuit including n-regions and p-regions is described, it is to be pointed out that the invention is not limited to this design. Rather, the n-regions and the p-regions may be exchanged to exemplarily define a pnp bipolar transistor. A design where a silicon substrate and different doped silicon layers are used has been described in FIG. 2. The invention is not limited to such a design and other suitable materials may be used for producing the structure shown in FIG. 2. In general, all well-known semiconductor materials, such as, for example, InP, GaAS, GaC, GaN, Ge, may be used.

When using the arrangement shown in FIG. 2, for example, in a circuit of FIG. 1, the emitter 130 of the bipolar transistor structure 116 is connected to the reference potential terminal GND, like, for example, ground, and the buried layer 122 and the p-zone of the diode structure 118 are connected to the terminal 108 (VCC) to drain, in the ESD case, the ESD pulse via the circuit element 114 to ground 112 and protect the device 104.

The two individual devices 116 and 118 shown in FIG. 2 in cooperation form the functional complete ESD protection element. The two devices 116 and 118 are arranged in the substrate 102. As is conventional in the field of manufacturing integrated circuits, the elements are separated and electrically insulated from each other by the trench 124. The two devices are connected to each other via the buried n-layer 122, wherein the buried layer 122 is selected to be as low-resistance as possible in order to be able to drain, in a high-current case, the current from the terminal VCC to the ground terminal GND in a low-resistance manner. This necessitates a relatively high voltage for switching on the low-resistance element 118, like, for example, the diode 118. In an exemplary case, around 13 volts are necessary for this, corresponding to a very high clamping voltage which is also applied to the device 104 to be protected.

Embodiments of the invention provide an ESD protection structure where the electrical connection between a transistor structure, like, for example, an npn bipolar transistor, and a diode structure within a substrate, like, for example, a silicon substrate, is significantly more high-resistance, which according to embodiments of the invention is achieved by leaving out the buried layer 122 (see FIG. 2) partly below the devices, i.e., the bipolar transistor and/or the diode device. When manufacturing, this may, for example, be achieved by a suitably selected implantation mask, no disadvantages resulting for manufacturing other devices during the manufacturing process. Embodiments of the invention improve the ESD protection of the protective structure by a factor of 2 to 3 compared to an arrangement as is shown in FIG. 2.

When omitting and/or reducing the area of the buried layer 122 below the ESD protection structure, the current flowing after the transistor structure breakdown produces a higher voltage at the diode structure such that it will switch already at lower currents and thus at a lower clamping voltage in the flow direction so that the high clamping voltage mentioned before which is also applied to the device 104 to be protected (see FIG. 1) is avoided.

Figure 3:
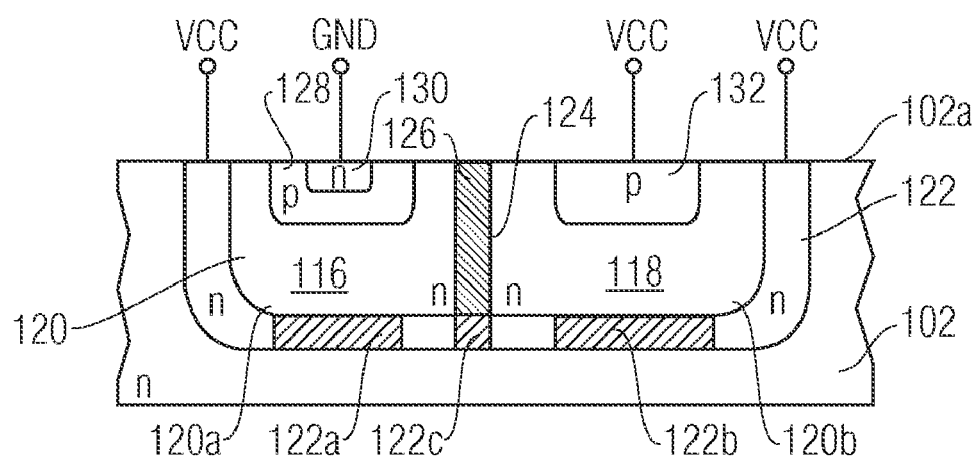
FIG. 3 shows a setup of an ESD protection circuit according to embodiments of the invention.

FIG. 3 shows the setup of an ESD protection circuit according to embodiments of the invention, wherein same elements already described referring to FIG. 2 are provided with the same reference numerals and are not described again. In FIG. 3, the buried n-layer 122 is shown again, wherein, however, a structuring of the n-layer 122 is indicated here by the regions 122a, 122b and 122c, wherein one, several or all the regions 122a to 122c may be left out here according to embodiments, i.e., represent regions where no implantation and/or no introduction of dopants has taken place in order to form the layer 122 and thus either the substrate material of the substrate 102 or the material of the EPI well 120 remains. Alternatively, instead of the recesses, it may also be provided for the thickness of the n-layer 122 to be reduced in the region below the active elements 116 and/or 118 as compared to the other regions, wherein both the recesses and the reduced thickness result in an increase in the resistance between the two elements 116 and 118, i.e., result in a high-resistance connection.

An ESD protection structure according to FIG. 2 having the buried layer 122 shown allows the device 104 to be protected, exemplarily up to 2000 volts. If the region of the n-layer 122 beneath the bipolar transistor 116 is dispensed with, i.e. if a recess is provided in the region 122a, the protection is improved to voltages of more than about 5000 volts.

Embodiments of the invention include a multi-layered buried layer comprising two or more (a plurality of) layers. The layers of the multi-layered buried layer include an increasing doping, starting at the layer adjacent to the substrate towards the EPI well. The multi-layered buried layer is either structured completely, for example, by recesses where all layers have been removed partly, or is structured partly, i.e., by forming recesses in one or several layers.

Figure 4:
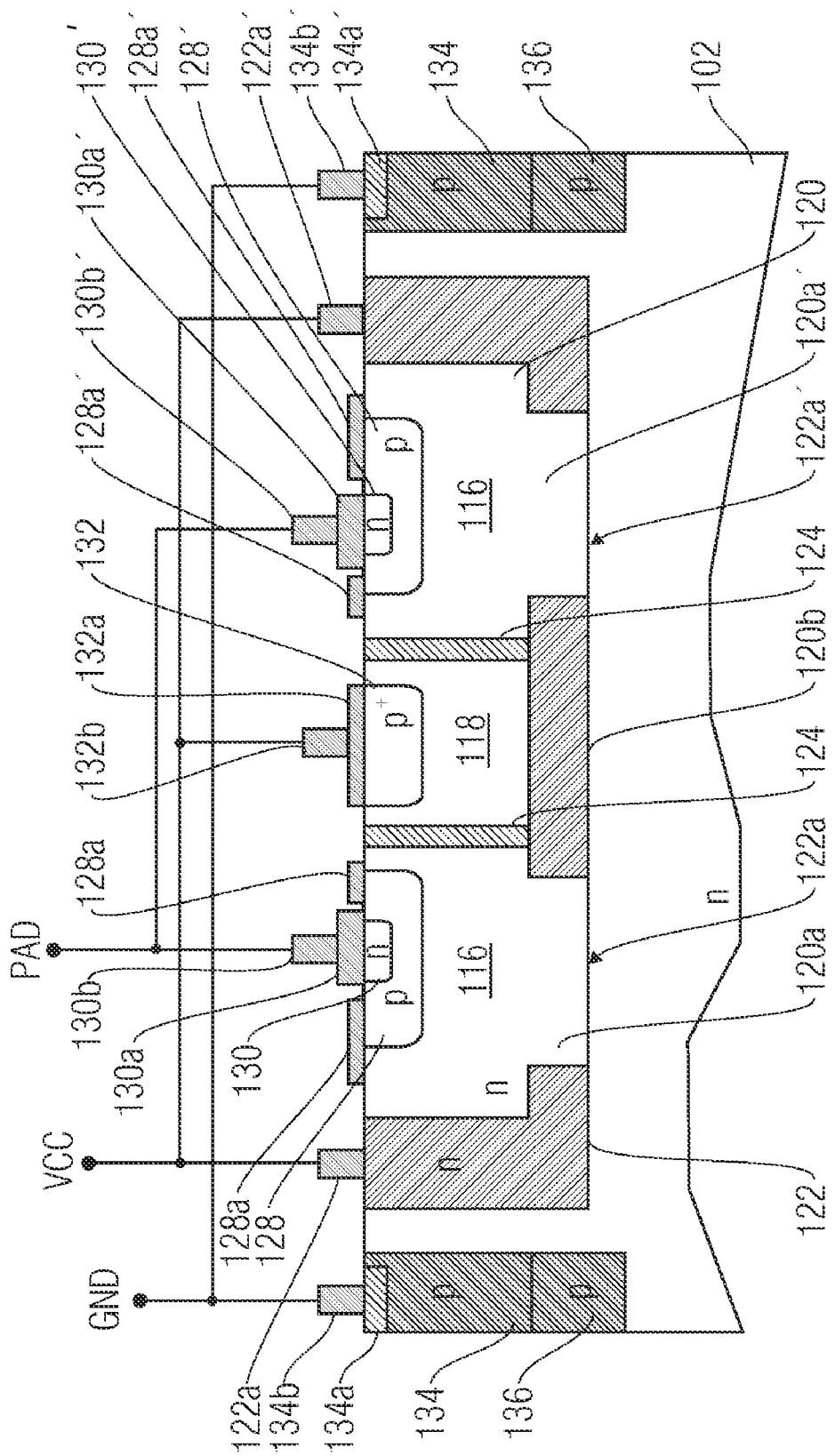
FIG. 4 shows a setup of the ESD protection circuit according to further embodiments of the invention.

FIG. 4 shows further embodiments of the invention where a high-resistance connection is provided between the two elements 116 and 118. In FIG. 4, elements having been described already referring to FIGS. 2 and 3 are provided with the same reference numerals. The difference to the setup of FIG. 3 is that FIG. 4 shows an npn bipolar transistor having two fingers. The EPI well 120 in the circuit shown in FIG. 4 is divided into regions 120a, 120b and 120a', wherein the elements of the transistor described referring to FIG. 3, namely the base 128, the emitter 130 and the collector 120a, are formed in the region 120a. The elements of the second finger of the transistor, namely the base 128', the emitter 130' and the collector 120a', are formed in the region 120a'. The diode 118 is formed between the two fingers, wherein the trench 124 insulates the diode from the adjacent regions of the transistor structure. It is further shown in FIG. 4 that a p-well 134 and a buried p-layer 136 are formed in the n-substrate 102. In FIG. 4, additionally the terminals of the individual sections mentioned before are shown and, as can be seen, when using the structure, like in a circuit of FIG. 1, the p-well 134 is connected to the reference potential GND. The emitter terminals are connected to the terminal PAD. The terminals PAD and GND may be connected to each other or be guided together or separately to an external terminal or to different external terminals, like, for example, an external ground line, and connected thereto. The base terminals of the bipolar transistor in turn are floating and the terminal VCC is connected to the buried n-layer and to the p-zone of the diode 118. FIG. 4 additionally shows the floating base contacts 128a and 128a', the emitter contacts 130a and 130a' and the diode contact 132a. These contacts are, for example, made of polysilicon. Any other suitable contact material may be used instead of polysilicon. Exemplarily, a suitable doping (e.g. phosphorous or boron) may be introduced by means of implantation. Alternatively, the contacts may be grown epitaxially.

The contacts 130b, 130b', 132b, 134b, 134b' for a connection to VCC, PAD and GND which are exemplarily made of aluminum, are additionally shown schematically. Generally, any electrically conducting materials may be used, like, for example, Au, Cu, W.

The structure shown in FIG. 4 includes the vertical two-finger npn bipolar transistor which in normal operation blocks at around 4.5 volts and makes the protection structure shown in FIG. 4 "electrically invisible" when being used, for example, in a circuit according to FIG. 1. In the ESD case, the current flow through the broken-down npn transistor 116 switches on the diode 118 to thus provide a low-resistance current path from the terminal VCC via the ESD protection structure to the reference potential GND. As is shown in FIG. 4, the regions of the n-layers 122a and 122a' below the finger are left out, i.e., have been masked in the process of implantation such that no dopant has been introduced here, so that "no buried n-layer" has been produced, the result being the high-resistance connection between the transistor and the diode mentioned before for switching on the diode early.

In the examples described before, a structure where the EPI well 120 comprises a trench 124 providing electrical insulation between the first element 116 and the second element 118 has been discussed. Alternatively, this insulation may be dispensed with, provided a sufficiently large distance between the two elements is maintained, the distance being selected such that a minimum distance will form in order to have only a small resistance on the drain distance forming in the ESD case. At the same time, the distance is selected such that a breakdown voltage on the distance from the diode to the base of the transistor is greater than the breakdown voltage $V_{CEO}$ of the transistor.

Although embodiments, where a transistor structure having two fingers used, have been described referring to FIG. 4, it is to be pointed out that the invention is not limited to this, but rather even transistor structures having several fingers, like, for example, 3, 4 or more fingers, may be used.

An ESD circuit structure where the EPI well 120 is divided by the trench 124 to electrically separate the diode structure 118 and the transistor structure 116 has been described referring to FIG. 2. The design shown referring to FIGS. 2 to 4 is a conventional one in IC (integrated circuit) technology according to which different elements are electrically insulated from one another to avoid mutual influence. The LOCOS process or the STI (shallow trench isolation) process, for example, are conventional insulation processes in IC technology. All the insulation methods are characterized in that they remove a greater or smaller amount of material (like, for example, silicon) from the surface 102a of the substrate 102 and transform it to an oxide with which the trench 124 is filled. However, this oxide usually removes the lateral current path which has the lowest doping and would offer the lowest resistance in a high-current case due to the small collision rate at the dopant atoms.

Further embodiments of the invention provide an ESD structure where an insulation between the two individual elements, exemplarily between the transistor and the diode, is dispensed with.

Figure 5:
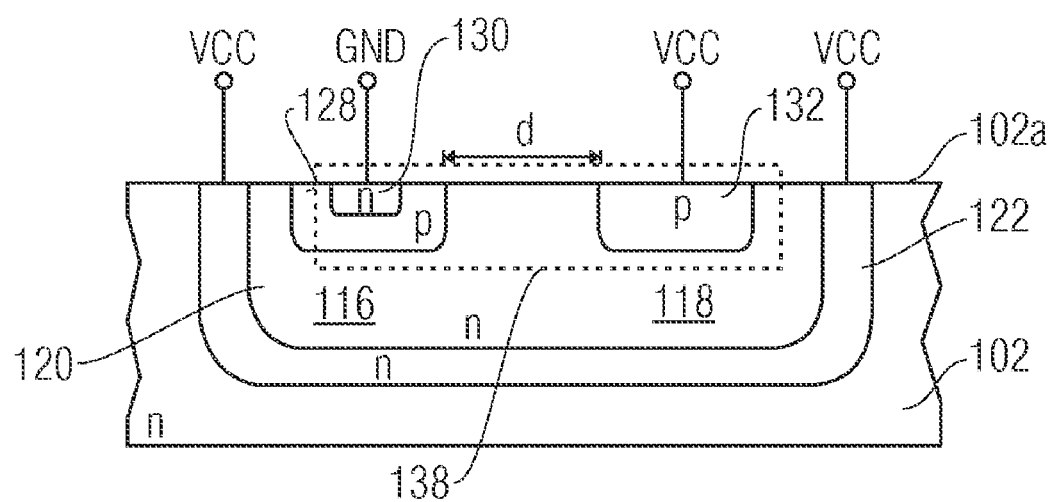
FIG. 5 shows a setup of an ESD protection circuit according to further embodiments of the invention.

FIG. 5 shows further embodiments of the invention, wherein, like in the descriptions of the above figures, elements having the same effect will be provided with the same reference numerals and not be described again.

The substrate 102 is shown in FIG. 5, wherein, as can be seen, no trench structure 124, 126 is provided here. In FIG. 5, the distance between the bipolar transistor 116 and the diode 118 is indicated by d. As described above, the distance d is selected such that the result is a minimum distance in order to have only a small resistance on the resulting drain distance in the ESD case. At the same time, the distance is selected such that a breakdown voltage on the distance from the diode to the base of the transistor is greater than the breakdown voltage $V_{CEO}$ of the transistor.

As can be seen from FIG. 5, the result between the two elements 116, 118 is a continuous low-resistance path made of a semiconductor material, like, for example, silicon, with no interruptions by an oxide. Indicated in broken lines in FIG. 5 is the region 138 forming a lateral thyristor structure between the terminal VCC connected to the region 132 and the ground terminal GND connected to the region 130. The structure shown in FIG. 5 includes the vertical npn bipolar transistor 116 which in normal operation blocks at, for example, about 4.5 volts and provides for the protection structure shown in FIG. 5 for the circuit 104 of FIG. 1 to be "electrically invisible". The distance d can be selected such that, in a first phase when an ESD pulse occurs, the transistor 116 and/or the diode 118 perform a respective function or functionality and that, in a second phase of the ESD case, the thyristor-like behavior is caused.

In the ESD case, the increasing current flow through the npn transistor will result in a breakdown thereof, which in turn will result in switching the current flow to the diode 118 which forms the laterally implemented thyristor structure (pnpn structure) together with the npn transistor. With a further increase in current, this thyristor-like structure will be ignited so that the region 138, i.e., the thyristor, will become low-resistance, for example, about 2.5 volts, and thus take up and drain the entire ESD current to ground.

A shallow trench insulation between the individual devices, as is, for example, shown in FIG. 2, results in a protection between about 1300 V and about 2450 V. According to embodiments of the invention, as has been described referring to FIG. 5, an improvement in protection to about 3000 V to about 5000 V is achieved when omitting the insulation.

Figure 6:
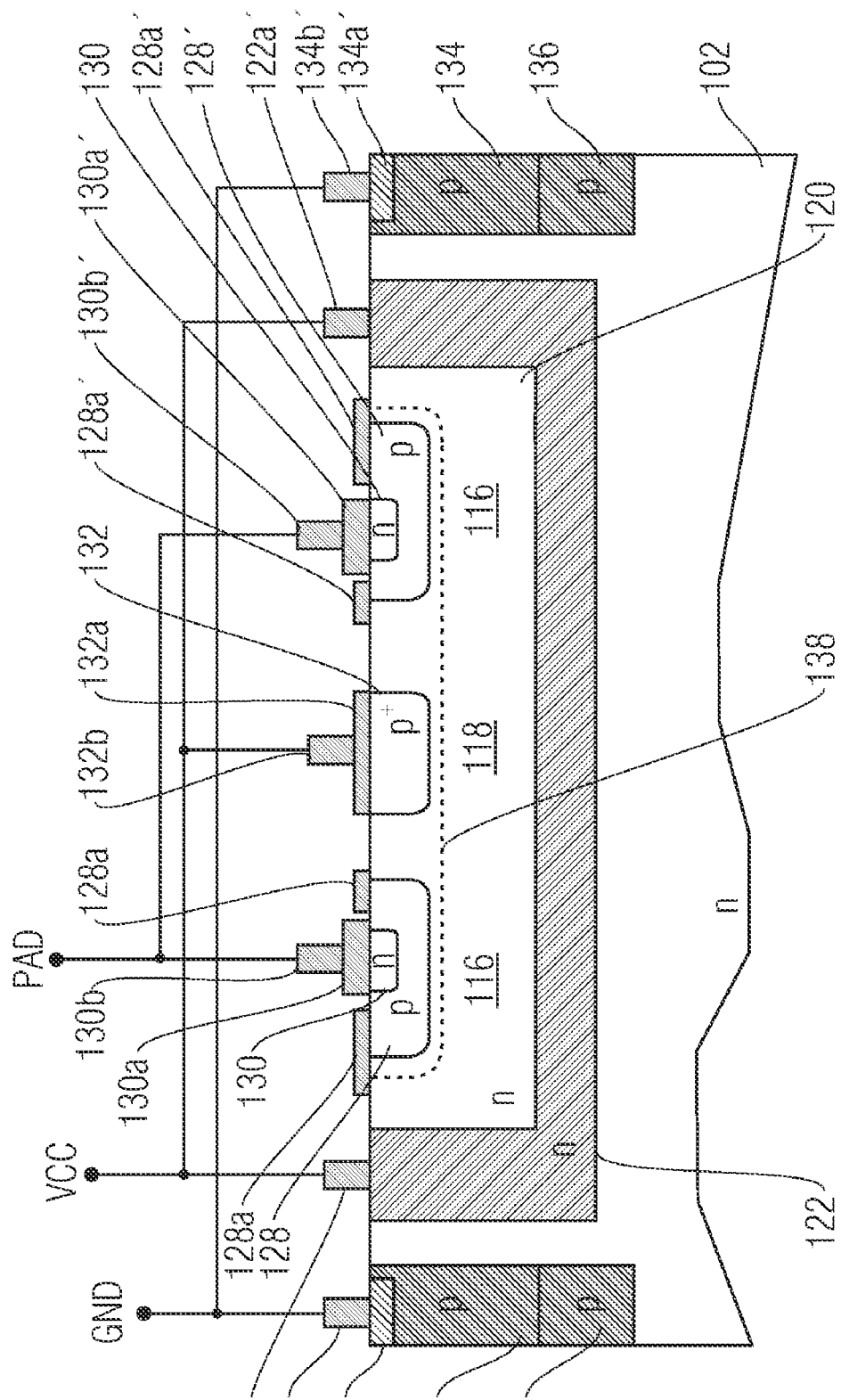
FIG. 6 shows a setup of an ESD protection circuit according to still further embodiments of the invention.

FIG. 6 shows further embodiments of the invention, similar to FIG. 4, wherein again similar elements are provided with the same reference numerals. As can be seen, no trench has been inserted in FIG. 6 for insulating the diode element 118 from the transistor element and the interruptions of the buried n-layer 122 shown in FIG. 4 are not provided here either.

Further embodiments of the invention relate to a combination of the embodiments described referring to FIGS. 3 and 4 and/or referring to FIGS. 5 and 6 in which, in addition to omitting the insulation according to FIGS. 5 and 6, the high-resistance connection described referring to FIGS. 3 and 4 between the elements is provided.

The embodiments of the invention described referring to FIGS. 3 to 6 are, for example, used as the ESD protection apparatus 114 in FIG. 1. In general, the ESD protection apparatus according to embodiments of the invention can be applied in all electrical circuits where the devices used in the circuit and/or circuits must be protected from high-current pulses.

A setup based on an n-substrate comprising a buried n-layer and an n-EPI well has been discussed when describing the embodiments of the invention. NPN bipolar transistor structure and pn diode structures are formed in the substrate formed in this way. It is obvious for those skilled in the art that the invention is not restricted to such a design, but that, instead of an n-substrate, a p-doped substrate in which a buried p-layer and a p-EPI well are formed may be employed so that a pnp transistor is formed instead of an npn transistor. Instead of introducing the buried layer and/or EPI well into the substrate 102, it may also be provided for the buried layer 122 to be arranged on a surface 102a of the substrate, on which in turn an epitaxial layer is applied, the buried EPI layer then being contacted by suitable through-contactings through the EPI layer to allow a connection to VCC. Additionally, the invention is not limited to a silicon material, rather all other common semiconductor materials, like, for example, Si, Ge, GaAS, InP, GaC, may be employed.

Instead of arranging the ESD protection circuit between the terminals VCC and GND or PAD, the ESD protection circuit may generally be arranged between any two pins of a circuit which are at different potentials.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An ESD protection apparatus comprising:
a semiconductor layer arranged in or on a substrate;
a buried layer arranged in or on the substrate, wherein the buried layer is arranged between the semiconductor layer and the substrate, and wherein at least one region of the buried layer has a higher dopant concentration than the semiconductor layer;
a vertical transistor structure arranged in the semiconductor layer;
a diode structure arranged in the semiconductor layer;
an electrical insulation structure arranged in the semiconductor layer between the transistor structure and the diode structure,
wherein the buried layer comprises one or more regions having a doping less than the at least one region or with a thickness being reduced when compared to other regions of the buried layer, thereby forming a high-resistance electrical connection between the transistor structure and the diode structure.

2. The apparatus according to claim 1, wherein the transistor structure is arranged in a first region of the semiconductor layer, and wherein the diode structure is arranged in a second region of the semiconductor layer which is laterally spaced apart from the first region.

3. The apparatus according to claim 2, wherein the one or more regions of the buried layer are between the first region and the second region.

4. The apparatus according to claim 2, wherein the one or more regions of the buried layer are below the first region and/or below the second region.

5. A protection apparatus comprising:
an epitaxial well arranged in a substrate and defining a collector region of a bipolar transistor;
a first base region of the bipolar transistor arranged in the epitaxial well;
a second base region of the bipolar transistor which is arranged laterally offset to the first base region in the epitaxial well;
a first emitter region of the bipolar transistor arranged in the first base region;
a second emitter region of the bipolar transistor arranged in the second base region;
a first region of a diode arranged in the epitaxial well between the first and second base regions, the epitaxial well further defining a second region of the diode;
a buried layer arranged in the substrate between the epitaxial well and the substrate, wherein the buried layer comprises one or more regions without a dopant or with a thickness being reduced when compared to other regions of the buried layer, thereby forming a high-resistance electrical connection between the bipolar transistor and the diode; and
an electrical insulation structure arranged in the epitaxial well between the first and second base regions and the first region of the diode.

6. The apparatus according to claim 5, wherein the one or more regions of the buried layer are below the first and second base regions of the bipolar transistor or below a region between the bipolar transistor and the diode.

7. A semiconductor structure comprising:
a transistor structure disposed in a semiconductor body, the transistor structure including first, second and third doped regions, the first doped region being spaced from the third doped region by the second doped region;
a diode structure disposed in the semiconductor body, the diode structure including a first doped region and a second doped region adjacent the first doped region;
a semiconductor region disposed in the semiconductor body, the semiconductor region comprising a high-resistance electrical connection extending between the first doped region of the transistor structure and the first doped region of the diode structure; and
an electrical insulation structure arranged in the semiconductor body between the transistor structure and the diode structure.

8. The semiconductor structure according to claim 7, wherein the high-resistance electrical connection comprises an undoped semiconductor region.

9. The semiconductor structure according to claim 7, wherein the high-resistance electrical connection comprises a narrow portion of a buried layer, the narrow portion having a thickness less than a thickness of another portion of the buried layer.

10. The semiconductor structure according to claim 9, wherein the transistor structure is located in a first region of the semiconductor body and the diode structure is arranged in a second region of the semiconductor body, the second region being laterally spaced from the first region, wherein the narrow portion of the buried layer is located adjacent an interface between the first region of the semiconductor body and the second region of the semiconductor body.

11. The semiconductor structure according to claim 9, wherein the transistor structure is located in a first region of the semiconductor body and the diode structure is arranged in a second region of the semiconductor body, the second region being laterally spaced from the first region, wherein the narrow portion of the buried layer is located beneath the first region of the semiconductor body.

12. The semiconductor structure according to claim 9, wherein the transistor structure is located in a first region of the semiconductor body and the diode structure is arranged in a second region of the semiconductor body, the second region being laterally spaced from the first region, wherein the narrow portion of the buried layer is located beneath the second region of the semiconductor body.

13. The semiconductor structure according to claim 9, wherein the transistor structure includes a multi-finger structure, the narrow portion of the buried layer located below fingers of the transistor structure.

14. The semiconductor structure according to claim 7, further comprising a buried layer disposed in the semiconductor body beneath the transistor structure and the diode structure.

15. The semiconductor structure according to claim 14, wherein the semiconductor region is part of the buried layer.

16. An ESD protection apparatus comprising:
a semiconductor layer disposed in a substrate;
a buried layer disposed between the semiconductor layer and the substrate, the buried layer comprising a first doped region and a second doped region, the first doped region having a higher dopant concentration than the semiconductor layer;
a vertical transistor structure arranged in the semiconductor layer;
a diode structure arranged in the semiconductor layer;
an electrical insulation structure arranged in the semiconductor layer between the transistor structure and the diode structure, wherein the second doped region has a lower doping than the first doped region, thereby forming a high-resistance electrical connection between the transistor structure and the diode structure.

17. The apparatus according to claim 16, wherein the first doped region and the second doped region are laterally adjacent.

18. The apparatus according to claim 16, wherein the second doped region has the same doping as the substrate.

19. The apparatus according to claim 16, wherein the transistor structure is arranged in a first region of the semiconductor layer, and wherein the diode structure is arranged in a second region of the semiconductor layer which is laterally spaced apart from the first region.

20. The apparatus according to claim 19, wherein the second doped region of the buried layer is between the first region and the second region.

21. The apparatus according to claim 16, wherein the electrical insulation structure extends up to a top surface of the buried layer without extending into the buried layer.

* * * * *